(12) United States Patent
Sinha et al.

(10) Patent No.: US 8,450,020 B2
(45) Date of Patent: May 28, 2013

(54) IN-VEHICLE ALGORITHM FOR FUEL CELL STACK HEALTH QUANTIFICATION

(75) Inventors: Puneet K. Sinha, Rochester, NY (US); Andrew J. Maslyn, Rochester, NY (US); Balasubramanian Lakshmanan, Pittsford, NY (US)

(73) Assignee: GM Global Technology Operations LLC, Detroit, MI (US)

( * ) Notice: Subject to any disclaimer, the term of this patent is extended or adjusted under 35 U.S.C. 154(b) by 238 days.

(21) Appl. No.: 13/094,300

(22) Filed: Apr. 26, 2011

(65) Prior Publication Data

US 2012/0276466 A1    Nov. 1, 2012

(51) Int. Cl.
*H01M 8/04* (2006.01)
(52) U.S. Cl.
USPC ............ 429/430; 429/431; 429/432; 429/443
(58) Field of Classification Search
USPC ................ 429/428, 430, 431, 432, 427, 443, 429/452; 73/432.1; 700/266, 286, 291
See application file for complete search history.

(56) References Cited

U.S. PATENT DOCUMENTS

| | | | |
|---|---|---|---|
| 2005/0095355 A1* | 5/2005 | Leistra et al. | 427/58 |
| 2010/0248070 A1* | 9/2010 | Fuss et al. | 429/483 |
| 2012/0178007 A1* | 7/2012 | Cai et al. | 429/431 |
| 2012/0282536 A1* | 11/2012 | Okamoto | 429/427 |

* cited by examiner

*Primary Examiner* — Raymond Alejandro
(74) *Attorney, Agent, or Firm* — John A. Miller; Miller IP Group, PLC

(57) ABSTRACT

A method for determining the health of fuel cells in a fuel cell stack. The method includes maintaining a constant flow of hydrogen to the anode side of the fuel cell stack, shutting off a flow of air to a cathode side of the fuel cell stack when a predetermined concentration of hydrogen in the anode side has been achieved, and identifying a catalyst surface area and a catalyst support surface area for catalyst layers in the fuel cell stack. The method also includes determining the total parasitic current of the fuel cell stack to determine a crossover parasitic current and a shorting resistance of the fuel cell stack. The method further includes calculating the catalyst surface area and the catalyst support surface area of the catalyst layers and comparing the difference between the identified catalyst surface area and the calculated catalyst surface area to estimate the change in the catalyst surface area.

20 Claims, 2 Drawing Sheets

IN-VEHICLE ALGORITHM FOR FUEL CELL STACK HEALTH QUANTIFICATION

BACKGROUND OF THE INVENTION

1. Field of the Invention

This invention relates generally to a method for quantifying the health of the membranes and electrodes in a fuel cell stack and, more particularly, to a method for estimating a cross-over parasitic current and a shorting resistance of the membranes in a fuel cell stack to determine the health of the fuel cells in the stack.

2. Discussion of the Related Art

Hydrogen is a very attractive fuel because it is renewable and can be used to efficiently produce electricity in a fuel cell. A hydrogen fuel cell is an electro-chemical device that includes an anode and a cathode with an electrolyte therebetween. The anode receives hydrogen gas and the cathode receives oxygen or air. The hydrogen gas is dissociated in the anode to generate free hydrogen protons and electrons. The hydrogen protons pass through the electrolyte to the cathode. The hydrogen protons react with the oxygen and the electrons in the cathode to generate water. The electrons from the anode cannot pass through the electrolyte, and thus are directed through a load to perform work before being sent to the cathode.

Proton exchange membrane fuel cells (PEMFC) are a popular fuel cell for vehicles. The PEMFC generally includes a solid polymer electrolyte proton conducting membrane, such as a perfluorosulfonic acid membrane. The anode and cathode typically include finely divided catalytic particles, usually platinum (Pt), supported on carbon particles and mixed with an ionomer. The catalytic mixture is deposited on opposing sides of the membrane. The combination of the anode catalytic mixture, the cathode catalytic mixture and the membrane define a membrane electrode assembly (MEA). MEAs require adequate fuel supply and humidification for effective operation.

Several fuel cells are typically combined in a fuel cell stack to generate the desired power. The fuel cell stack receives a cathode input gas, typically a flow of air forced through the stack by a compressor. Not all of the oxygen is consumed by the stack and some of the air is output as a cathode exhaust gas that may include water as a stack by-product. The fuel cell stack also receives an anode hydrogen input gas that flows into the anode side of the stack.

A fuel cell stack typically includes a series of bipolar plates positioned between the several MEAs in the stack, where the bipolar plates and the MEAs are positioned between two end plates. The bipolar plates include an anode side and a cathode side for adjacent fuel cells in the stack. Anode gas flow channels are provided on the anode side of the bipolar plates that allow the anode reactant gas to flow to the respective MEA. Cathode gas flow channels are provided on the cathode side of the bipolar plates that allow the cathode reactant gas to flow to the respective MEA. One end plate includes anode gas flow channels, and the other end plate includes cathode gas flow channels. The bipolar plates and end plates are made of a conductive material, such as stainless steel or a conductive composite. The end plates conduct the electricity generated by the fuel cells out of the stack. The bipolar plates also include flow channels through which a cooling fluid flows.

The MEAs are permeable and thus allow nitrogen in the air from the cathode side of the stack to permeate therethrough and collect in the anode side of the stack, often referred to as nitrogen cross-over. Even though the anode side pressure may be slightly higher than the cathode side pressure, cathode side partial pressures will cause oxygen and nitrogen to permeate through the membrane. The permeated oxygen combusts in the presence of the anode catalyst, but the permeated nitrogen in the anode side of the fuel cell stack dilutes the hydrogen. If the nitrogen concentration increases above a certain percentage, such as 50%, fuel cells in the stack may become starved of hydrogen. If the anode becomes hydrogen starved, the fuel cell stack may fail to produce adequate electrical power and may suffer damage to the electrodes in the fuel cell stack. As the membranes age, they may become thinner, thereby allowing nitrogen to permeate to the anode side at a faster rate.

It is known in the art to provide a bleed valve at the anode exhaust gas output of the fuel cell stack to remove nitrogen from the anode side of the stack. It is also known in the art to estimate the molar fraction of nitrogen in the anode side using a model to determine when to perform the bleed of the anode side or anode sub-system. However, the model estimation may contain errors, particularly as degradation of the components of the fuel cell system, such as the membranes, occurs over time. If the anode nitrogen molar fraction estimation is significantly higher than the actual nitrogen molar fraction, the fuel cell system will vent more anode gas than is necessary, i.e., waste fuel. If the anode nitrogen molar fraction estimation is significantly lower than the actual nitrogen molar fraction, the system will not vent enough anode gas and may starve the fuel cells of reactants, which may damage the electrodes in the fuel cell stack.

Depending on power requirements of a fuel cell system, the voltage of the fuel cell stack changes. This is known as voltage cycling of the stack. Voltage cycling causes the catalyst particles to change, for example, the catalyst particles may aggregate, thereby reducing the surface area on which the electrochemical reaction may take place. This causes inefficiencies and diminishes the durability of the fuel cell. Additionally, aggregation of catalyst particles may cause the catalyst support to collapse. Corrosion of the catalyst layers can also occur, which also reduces the durability of the fuel cell.

There is a need in the art to determine the health of the electrodes and the membranes in a fuel cell stack throughout the lifetime of the membranes in the stack in a way that may be performed on a fuel cell stack in a vehicle without requiring the vehicle to come in for servicing and without requiring burdensome testing conditions that may affect the normal operation of the vehicle. The ability to quantify electrode and membrane health in a fuel cell vehicle will provide a multitude of possibilities to optimize vehicle efficiency and power based on driving demands.

SUMMARY OF THE INVENTION

In accordance with the teachings of the present invention, a method is disclosed for determining the health of fuel cells in a fuel cell stack. The method includes maintaining a constant flow of hydrogen to the anode side of the fuel cell stack, shutting off a flow of air to a cathode side of the stack when a predetermined concentration of hydrogen in the anode side has been achieved and identifying a catalyst surface area and a catalyst support surface area for catalyst layers in the fuel cell stack. The method also includes determining the total parasitic current of the fuel cell stack to determine a cross-over parasitic current and a shorting resistance of the fuel cell stack. The method further includes calculating the catalyst surface area and the catalyst support surface area of the catalyst layers and comparing the difference between the identified catalyst surface area and the calculated catalyst surface area to estimate the change in the catalyst surface area.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a method for quantifying the health of fuel cell membranes and electrodes in a fuel cell stack over the life of the stack is merely exemplary in nature, and is in no way intended to limit the invention or its applications or uses.

Figure 1:
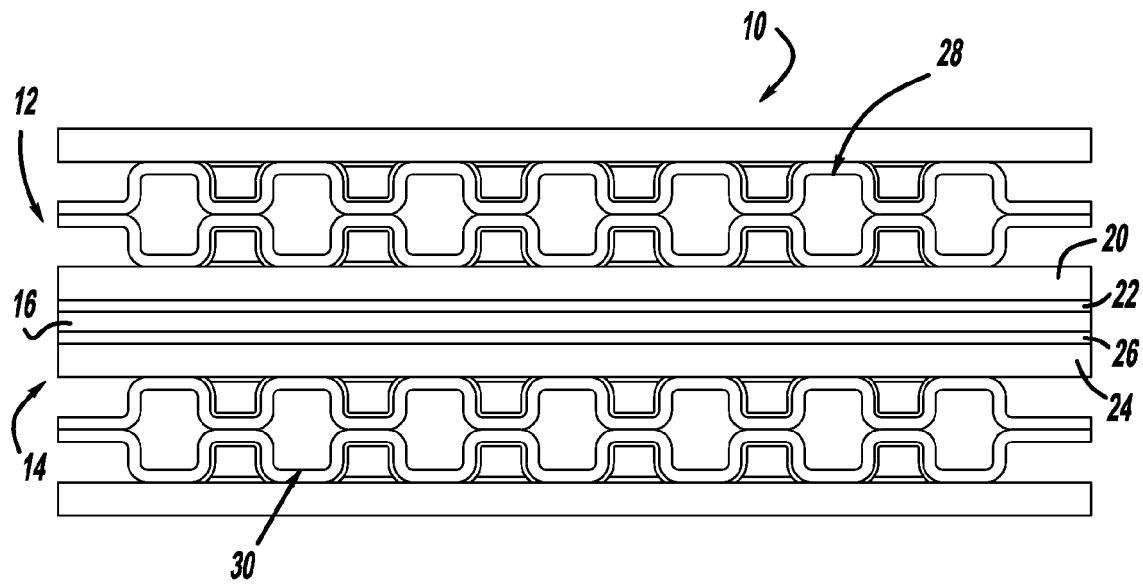
FIG. 1 is a cross-sectional view of a fuel cell.

FIG. 1 is a cross-sectional view of a fuel cell 10 that is part of a fuel cell stack of the type discussed below. The fuel cell 10 includes a cathode side 12 and an anode side 14 separated by a perfluorosulfonic acid membrane 16. A cathode side diffusion media layer 20 is provided on the cathode side 12, and a cathode side catalyst layer 22 is provided between the membrane 16 and the diffusion media layer 20. Likewise, an anode side diffusion media layer 24 is provided on the anode side 14, and an anode side catalyst layer 26 is provided between the membrane 16 and the diffusion media layer 24. The catalyst layers 22 and 26 and the membrane 16 define an MEA. The diffusion media layers 20 and 24 are porous layers that provide for input gas transport to and water transport from the MEA. A cathode side flow field plate 28 is provided on the cathode side 12, and an anode side flow field plate or bipolar plate 30 is provided on the anode side 14.

Figure 2:
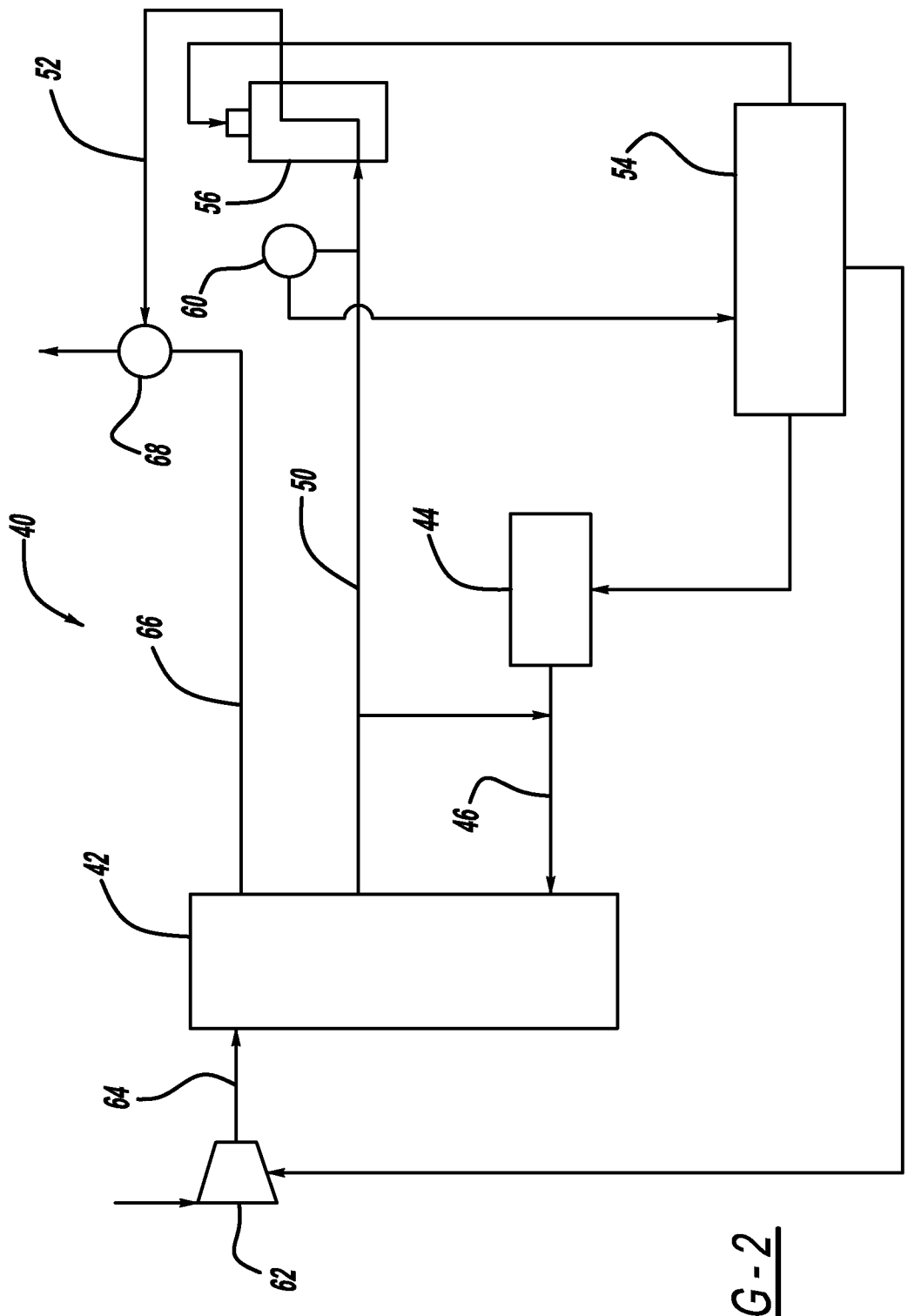
FIG. 2 is a simplified block diagram of a fuel cell system.

FIG. 2 is a simplified block diagram of a fuel cell system 40 including a fuel cell stack 42. Hydrogen gas from a hydrogen source 44 is provided to the anode side of the fuel cell stack 42 on line 46. An anode exhaust gas is output from the fuel cell stack 42 on line 50 and is recirculated to the line 46. A bleed valve 56 is periodically opened to bleed the anode exhaust gas through a bleed line 52 to remove nitrogen from the anode sub-system. A pressure sensor 60 is also provided in the line 50 to measure the pressure of the anode sub-system of the fuel cell system 40. In an alternate embodiment, the pressure sensor 60 may be positioned in the line 46, as is known to those having skill in the art.

FIG. 2 illustrates one example of a fuel cell system that may be used with the present invention. Other examples include fuel cell systems that employ a split stack design with anode flow-shifting.

Air from a compressor 62 is provided to the cathode side of the fuel cell stack 42 on line 64. A cathode gas is output from the fuel cell stack 42 on a cathode gas line 66. A mixing device 68 is provided in the line 66 for mixing the cathode gas and the bled anode exhaust gas on the line 52.

A controller 54 monitors the pressure of the anode sub-system of the fuel cell system 40, as measured by the pressure sensor 60, controls the speed of the compressor 62, controls the injection of hydrogen from the hydrogen source 44 to the anode side of the stack 42, and controls the position of the anode bleed valve 56, as is discussed in more detail below. The controller 54 employs a model to estimate the permeation of nitrogen from the cathode side to the anode side through the stack membranes and the concentration of nitrogen in the anode side of the stack 42. In addition, the controller 54 measures the length of time required for the anode sub-system to reach atmospheric pressure after the fuel cell system 40 has been shutdown.

The controller 54 also employs an algorithm that determines electrode and membrane health by quantifying the parasitic current of the membranes in the stack 42 and by quantifying the catalyst surface area and the catalyst support surface area of the catalyst layers 22 and 26. The algorithm also determines whether the parasitic current is due to gases crossing the membrane or is due to shorting currents through the membrane, as is discussed in more detail below.

Parasitic current directly correlates to membrane health. When the parasitic current is low, membranes are healthy and are functioning as expected. Thus, using the algorithm that quantifies the parasitic current discussed above, the health of the membranes may be determined throughout the life of the fuel cell stack 42. The parasitic current for each membrane 16 in the stack 42 may be determined by measuring the voltage of each cell, or may be determined by monitoring average cell voltage and minimum cell voltage. The variation in parasitic current of the membranes 16 may be used to determine whether rapid degradation of a membrane 16 in the stack 42 is occurring, or whether the membranes 16 are degrading more uniformly.

If it is determined, based on stack characteristics, that the parasitic current of one or more of the membranes 16 is large enough to indicate a singular event, such as a shorting event, the fuel cell stack 42 may need to be shutdown and repaired. The controller 56 may indicate that servicing of the stack 42 is needed if a predetermined threshold of a shorting resistance is achieved. If, however, the parasitic current of one or more of the membranes 16 does not indicate a shorting event, i.e., the membranes 16 are degrading uniformly, the controller 54 may adapt the operation of the fuel cell system 10 to compensate for the degradation of the membranes 16. For example, if it is determined that hydrogen is crossing over, i.e., cross-over parasitic current is increasing in the membranes 16, nitrogen may be building up in the anode side of the stack 42. Under such circumstances, the algorithm may cause the controller 56 to adjust the bleed schedule of the anode side of the stack 42 to remove the build-up of nitrogen in the anode side, i.e., the algorithm may cause the controller 56 to adapt the bleed schedule if a predetermined threshold of cross-over parasitic current is achieved.

Making precise calculations regarding the parasitic current of the membranes in a stack may be impractical for a fuel cell stack in a vehicle, because specific test parameters are difficult to achieve and may impact the normal operation of the vehicle. However, the parasitic current may be estimated with a reasonable degree of accuracy by running a hydrogen takeover test, which includes maintaining a constant flow of hydrogen to the anode side and shutting off the flow of air to the cathode side at a time when the hydrogen concentration in the anode side is known, as is known to those skilled in the art. The algorithm discussed above is employed to estimate the total parasitic current of the membranes in the stack, the parasitic current caused by cross-over current and the parasitic current caused by shorting current, or shorting resistance, during three stages of the single hydrogen takeover test. Shorting resistance is determined from current density, as is known to those with skill in the art. During each stage, the voltage drop of the fuel cell stack is monitored, as is described in more detail below.

In addition to estimating parasitic current, the algorithm also estimates the health of the electrodes, i.e., the catalyst layers 22 and 26, of the fuel cells in the stack 12. Voltage cycling of the fuel cell stack 12 may cause the surface area of the catalyst, typically platinum, of the catalyst layers 22 and 26 to change. For example, the catalyst of the catalyst layers 22 and 26 may aggregate due to voltage cycling. Aggregation of the catalyst particles reduces the amount of catalyst surface area and may also cause the catalyst support structure, typically carbon, to collapse. Thus, the algorithm monitors the membrane health and also the health of the electrodes in the fuel cells of the fuel cell stack 12.

Figure 3:
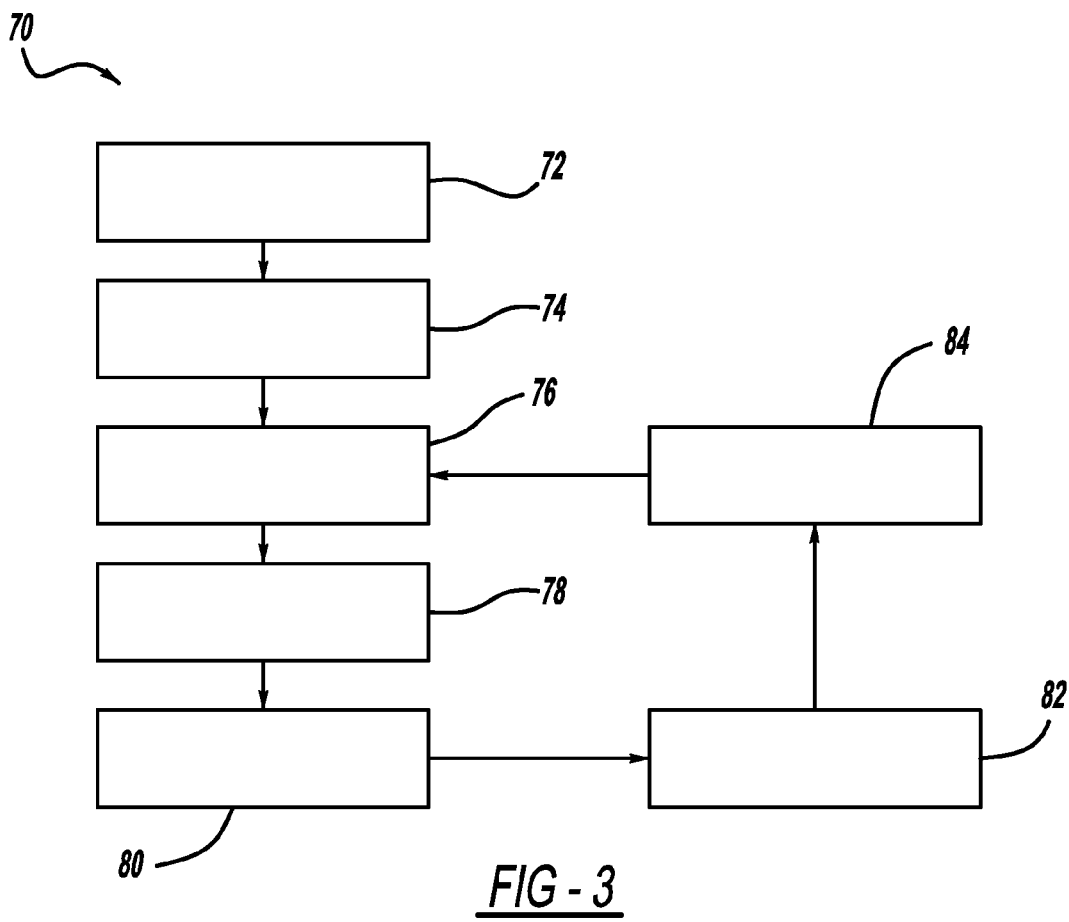
FIG. 3 a flow chart diagram of an algorithm for quantifying electrode and membrane health in a fuel cell stack.

FIG. 3 is a flow diagram 70 of an algorithm for quantifying electrode and membrane health. At box 72, a hydrogen takeover test is performed, for example, when the vehicle is shutdown or is in a standby event. Once the cathode air flow is shut off, the voltage drop of the fuel cells in the stack 42 is measured. The measured voltage may be from each fuel cell 10 or from the average cell voltage, and minimum cell voltage may also be monitored. A predetermined drop in voltage is measured during the first stage at the box 72. For example, the first 200 mV drop in stack voltage from the open current voltage (OCV) may be monitored.

Because the range of the drop in voltage is relatively small, for example, 200 mV, it is assumed that any shorting resistance is constant. Capacitance of the fuel cell stack 42 is known based on the amount of catalyst and catalyst support loading in the MEA. The physical volume of the cathode side of the stack 42 is also known, therefore, the amount of oxygen present in the cathode side is known, and it is also known how much current is required to consume the oxygen in the cathode side of the stack 42.

Stage 1 may be defined as the stage where the gas phase of oxygen in the cathode is mostly consumed by parasitic currents. For example, for stage 1, between open circuit voltage and 200 mV below open circuit voltage, the amount of catalyst surface area and catalyst support surface area on the cathode side of the stack 42 are assumed at box 74, and the total parasitic current of the membranes 16 in the stack 42 is calculated at box 76 using the equation:

$$I_P \Delta t = -C_1 \Delta V + \beta_1 \left[ 1 - 10^{\frac{\Delta V}{b \gamma_{ORR}}} \right] \quad (1)$$

Where $I_P$ is the total parasitic current, t is time, $C_1$ is the capacitance factor of stage 1, V is voltage, $\beta_1$ is the geometric factor of stage 1, b is the tafel slope and $\gamma_{ORR}$ is the oxygen reduction reaction (ORR) order (0.79).

The capacitance factor $C_1$ of stage 1 may be defined as:

$$C_1 = (C_{Ca-H} + C_{Ca-DL}) \cdot rf_{Ca} + C_{S-DL} rf_S \quad (2)$$

Where $C_{Ca-H}$ is the intrinsic catalyst-hydrogen pseudo-capacitance, $C_{Ca-DL}$ is the intrinsic catalyst double layer capacitance, $rf_{Ca}$ is the roughness factor of the catalyst, $C_{S-DL}$ is the intrinsic catalyst support double layer capacitance and $rf_S$ is the roughness factor of catalyst support.

The geometric factor $\beta_1$ of stage 1 may be defined as:

$$\beta_1 = \frac{4FV_{Cath}}{A_{MEA}} C_{O2} \quad (3)$$

Where F is faraday's constant (96,485 C/mol), $V_{Cath}$ is the total cathode volume containing oxygen, $A_{MEA}$ is the active area of the MEA and $C_{O2}$ is the concentration of oxygen in the cathode.

The roughness factor $rf_{Ca}$ of the catalyst may be defined as:

$$rf_{Ca} = 10 \cdot loading \cdot ECA \quad (4)$$

Where loading is the catalyst loading in the MEA in $mg_{Ca}/cm^2$, and ECA is the catalyst surface area in $m_{Ca}^2/g_{Ca}$.

Similarly, the roughness factor $rf_S$ of catalyst support may be defined as:

$$rf_S = 10 \cdot \left( loading \cdot \frac{100 - \% \, Ca}{100} \right) \cdot S_{surface \, area} \quad (5)$$

Where $S_{surface \, area}$ is the catalyst support surface area.

The total parasitic current $I_P$, calculated by the algorithm at the box 76 indicates how well the membranes 16 in the stack 42 are acting as insulators and as gas separators.

Next, the algorithm calculates how much of the total parasitic current is caused by the cross-over parasitic current, i.e., caused by gases crossing the membranes 16 during stage 3, which measures a predetermined drop in voltage of the stack 42. Stage 3 may be defined as the stage where hydrogen adsorption on the catalyst and catalyst support surface occurs. The numerical values used to define each of Stages 1, 2 and 3 are merely exemplary and are not intended to limit the scope of the algorithm described herein. For example, a drop in 300 mV after stages 1 and 2 may be monitored. While the voltage drop for stage 2 is measured first, which may be defined as the stage where most of the oxygen in the form of catalyst oxide and support double layer is consumed, e.g., a drop in 500 mV from the ending voltage of stage 1, the algorithm must monitor the voltage drop of stage 3 and calculate cross-over current from stage 3 because during stage 3 the shorting resistance may be assumed to be zero because the voltage of the stack 42 is so low. Cross-over parasitic current can be calculated according to the equation:

$$I_{XO} \Delta t = -C_3 \Delta V + \beta_3 [10^{-V(t)/0.035} - 10^{-V(t=0)/0.035}] \quad (6)$$

Where $I_{XO}$ is cross-over current, $C_3$ is the capacitance factor of stage 3 and $\beta_3$ is the geometric factor of stage 3.

The capacitance factor $C_3$ of stage 3 may be defined as:

$$C_3 = (C_{Ca-H} + C_{Ca-DL}) \cdot rf_{Ca} + C_{S-DL} \cdot rf_S \quad (7)$$

The geometric factor $\beta_3$ of stage 3 may be defined as:

$$\beta_3 = \frac{2FV_{Cath}}{A_{MEA}} C_{H2} \quad (8)$$

Next, the cathode catalyst surface area and catalyst support surface area from stage 2 are re-calculated at box 82 using the equation:

$$\frac{\Delta t}{C_2 R_{sh}} = -\ln \left( 1 + \frac{\Delta V}{R_{sh} I_{XO} + V_{t=0}^{stage2}} \right) \quad (9)$$

Where $C_2$ is the capacitance factor of stage 2, $R_{sh}$ is the shorting resistance and $V_{t=0}^{stage2}$ is the voltage at the start of stage 2. These values are then compared to the assumed values at the box 74 and numerical methods are used to iterate to an acceptable solution within a predetermined error value, such as within a one percent error.

The capacitance factor $C_2$ of stage 2 may be defined as:

$$C_s = \begin{Bmatrix} C_1 & OCV - 200 \geq V > 600 \text{ mV} \\ C_{S-DL}^{Intrinsic} \cdot rf_S + C_{Ca-DL}^{Intrinsic} \cdot rf_{Ca} & 600 \geq V > 300 \text{ mV} \end{Bmatrix} \quad (10)$$

The capacitance term is expected to change because pseudo-capacitance is no longer being discharged below approximately 600 mV vs. reversible hydrogen electrode (RHE), i.e., oxides adsorbed on the catalyst surface are totally consumed by hydrogen. Now, the calculations are simplified by assuming that shorting is a function of voltage. Thus, a relationship between shorting resistance, cross-over parasitic current and total parasitic current may be found using the following equation:

$$R_{sh} = \frac{V_{avg}^{stage1}}{I_P + I_{XO}} \quad (11)$$

Where $I_{XO}$ is cross-over parasitic current and $V_{avg}^{stage1}$ is the average cell voltage during stage 1.

Thus, stage 2 capacitance of the measured drop in voltage of stage 2 is determined last because at this point total parasitic current, cross-over parasitic current and shorting resistance are known. As discussed above, the cross-over parasitic current as determined after stage 3 must be determined before the shorting resistance is determined because at stage 3 the shorting current, or resistance, may be assumed to be zero. Therefore, the cross-over parasitic current is the only unknown in stage 3 and may be determined according to equation 6 discussed above.

If the difference between the calculated catalyst surface area, ECA, and the assumed catalyst surface area is less than a predetermined value, for example, one percent, and the difference between the calculated catalyst support surface area, $S_{surface\ area}$, and the assumed catalyst support surface is less than a predetermined value, then the algorithm will stop calculating at the box 82. If the difference is greater than a predetermined value, such as one percent, the algorithm will repeat the calculations discussed above at the box 82. Based on the difference between the calculated catalyst surface area and the assumed catalyst surface area, and the difference between the calculated catalyst support surface area and the assumed catalyst support surface area, the algorithm will estimate the next catalyst surface area value at box 84, i.e., the change in catalyst surface area. The algorithm may indicate that fuel cell stack 12 servicing is needed if a predetermined threshold value of catalyst surface area is achieved. The predetermined threshold value is dependent on stack characteristics.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for determining health of fuel cells in a fuel cell stack, said method comprising:
   maintaining a constant flow of hydrogen to an anode side of the fuel cell stack and shutting off a flow of air to a cathode side of the fuel cell stack when a predetermined concentration of hydrogen in the anode side is achieved;
   identifying a predetermined drop in voltage of the fuel cell stack after shutting off the flow of air to the cathode side;
   identifying a catalyst surface area and a catalyst support surface area of catalyst layers in the fuel cell stack;
   determining a total parasitic current of membranes in the fuel cell stack;
   determining a cross-over parasitic current and a shorting resistance of the membranes from the total parasitic current;
   calculating the catalyst surface area and the catalyst support surface area based on a capacitance factor, the shorting resistance and a predetermined voltage;
   comparing the difference between the identified catalyst surface area and the calculated catalyst surface area to estimate the change in the catalyst surface area; and
   comparing the difference between the identified catalyst support surface area and the calculated catalyst support surface area to estimate the change in the catalyst support surface area.

2. The method according to claim 1 wherein identifying the predetermined drop in voltage of the fuel cell stack after shutting off the flow of air to the cathode side includes identifying the drop in voltage of the fuel cell stack in three stages, where each stage is a predetermined drop in voltage after shutting off the flow of air to the cathode side.

3. The method according to claim 2 wherein a first stage of the three stages includes measuring about a 200 mV drop in voltage from an open current voltage.

4. The method according to claim 3 wherein a second stage of the three stages includes measuring about a 500 mV drop in voltage from an ending voltage of the first stage.

5. The method according to claim 4 wherein a third stage of the three stages includes measuring about a 300 mV drop in voltage from an ending voltage of the second stage.

6. The method according to claim 3 wherein the total parasitic current of the first stage is determined after the drop in voltage of the first stage is complete.

7. The method according to claim 5 wherein the cross-over parasitic current is determined after the drop in voltage of the third stage is complete.

8. The method according to claim 4 wherein the shorting resistance is determined after the drop in voltage of the second stage is complete.

9. The method according to claim 4 wherein the catalyst surface area and catalyst support surface area are calculated after the second stage is complete.

10. The method according to claim 1 wherein comparing the difference between the identified catalyst surface area and the calculated catalyst surface area and the identified catalyst support surface area and the calculated catalyst support surface area includes iterating to an acceptable solution within a predetermined error value.

11. A method for determining health of fuel cells in a fuel cell stack, said method comprising:
    performing a single hydrogen takeover test that includes maintaining a constant flow of hydrogen to an anode side of the fuel cell stack and shutting off a flow of air to a cathode side of the fuel cell stack when a predetermined concentration of hydrogen in the anode side is achieved;
    identifying a predetermined drop in voltage of the fuel cell stack after the single hydrogen takeover test that includes identifying the drop in voltage of the fuel cell stack in a first stage, a second stage and a third stage;
    identifying a catalyst surface area and a catalyst support surface area of catalyst layers in the fuel cell stack;

determining a total parasitic current of membranes in the fuel cell stack after a predetermined drop in voltage of the first stage is complete;

determining a cross-over parasitic current of the membranes in the fuel cell stack from the total parasitic current after a predetermined drop in voltage of the third stage is complete;

determining a shorting resistance of the membranes in the fuel cell stack from the total parasitic current and from the cross-over parasitic current using the drop in voltage from the second stage;

calculating the catalyst surface area and the catalyst support surface area after the second stage is complete; and comparing the difference between the identified catalyst surface area and the calculated catalyst surface area to estimate the change in the catalyst surface area and comparing the difference between the identified catalyst support surface area and the calculated catalyst support surface area to estimate the change in the catalyst support surface area.

12. The method according to claim 11 wherein the first stage of identifying a predetermined drop in voltage of the fuel cell stack includes measuring about a 200 mV drop in voltage from an open current voltage, the second stage of identifying a predetermined drop in voltage of the fuel cell stack includes measuring about a 500 mV drop in voltage from an ending voltage of the first stage, and the third stage of identifying a predetermined drop in voltage of the fuel cell stack includes measuring about a 300 mV drop in voltage from an ending voltage of the second stage.

13. The method according to claim 11 wherein comparing the difference between the identified catalyst surface area and the calculated catalyst surface area and the identified catalyst support surface area and the calculated catalyst support surface area includes iterating to an acceptable solution within a predetermined error value.

14. A method for determining fuel cell health of fuel cells in a fuel cell stack, said method comprising:

performing a hydrogen takeover test that includes maintaining a constant flow of hydrogen to the anode side of the fuel cell stack and shutting off a flow of air to a cathode side of the fuel cell stack when a predetermined concentration of hydrogen in the anode side is achieved;

identifying a catalyst surface area and a catalyst support surface area of catalyst layers in the fuel cell stack;

determining a total parasitic current;

determining a cross-over parasitic current and a shorting resistance;

calculating the catalyst surface area and the catalyst support surface area; and comparing the difference between the identified catalyst surface area and the calculated catalyst surface area to estimate the change in the catalyst surface area.

15. The method according to claim 14 further comprising identifying a predetermined drop in voltage of the fuel cell stack after the hydrogen takeover test that includes identifying the predetermined drop in voltage of the fuel cell stack in a first stage, a second stage and a third stage, where the first stage of identifying the predetermined drop in voltage of the fuel cell stack includes measuring about a 200 mV drop in voltage from an open current voltage, the second stage of identifying a predetermined drop in voltage of the fuel cell stack includes measuring about a 500 mV drop in voltage from an ending voltage of the first stage, and the third stage of identifying a predetermined drop in voltage of the fuel cell stack includes measuring about a 300 mV drop in voltage from an ending voltage of the second stage.

16. The method according to claim 15 wherein determining the total parasitic current occurs after the predetermined drop in voltage of the first stage.

17. The method according to claim 15 wherein determining the cross-over parasitic current occurs after the predetermined drop in voltage of the third stage is complete and determining shorting resistance includes utilizing the measured predetermined drop in voltage of the fuel cell stack during the second stage and the determined cross-over parasitic current.

18. The method according to claim 14 further comprising comparing the difference between the identified catalyst support surface area and the calculated catalyst support surface area to estimate the change in the catalyst support surface area.

19. The method according to claim 18 wherein comparing the difference between the identified catalyst surface area and the calculated catalyst surface area and the identified catalyst support surface area and the calculated catalyst support surface area includes iterating to an acceptable solution within a predetermined error value.

20. The method according to claim 19 wherein the predetermined error value is one percent.

* * * * *